United States Patent
Williams et al.

(10) Patent No.: US 11,521,665 B2
(45) Date of Patent: Dec. 6, 2022

(54) NON-VOLATILE MEMORY HAVING WRITE DETECT CIRCUITRY

(71) Applicant: NXP USA, Inc., Austin, TX (US)

(72) Inventors: Jacob T. Williams, Austin, TX (US); Gilles Joseph Maurice Muller, Austin, TX (US); Karthik Ramanan, Austin, TX (US); Jon Scott Choy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/302,472

(22) Filed: May 4, 2021

(65) Prior Publication Data
US 2022/0358982 A1    Nov. 10, 2022

(51) Int. Cl.
*G11C 11/16* (2006.01)
*G11C 17/18* (2006.01)
*G11C 17/16* (2006.01)

(52) U.S. Cl.
CPC ........ *G11C 11/1675* (2013.01); *G11C 11/161* (2013.01); *G11C 11/1673* (2013.01);
(Continued)

(58) Field of Classification Search
CPC .............. G11C 11/1675; G11C 11/161; G11C 11/1673; G11C 17/16; G11C 17/18; G11C 11/1655; G11C 11/1657
(Continued)

(56) References Cited

U.S. PATENT DOCUMENTS

| | | | |
|---|---|---|---|
| 7,920,407 B2 | 4/2011 | Chen et al. | |
| 9,478,287 B2 | 10/2016 | Chou et al. | |

(Continued)

FOREIGN PATENT DOCUMENTS

WO    WO-2004066308 A1 *  8/2004  ............ G11C 11/16

OTHER PUBLICATIONS

Chou, et al.: "An N40 256K+44 Embedded RRAM Macro with SL-Precharge SA and Low-Voltage Current Limiter to Improve Read and Write Performance", ISSCC 2018 / SESSION 30 / Emerging Memories / 30.1, 2018, IEEE International Solid-State Circuits Conference, TSMC, Hsinchu, Taiwan, 978-1-5090-4940-0/18/$31.00 © 2018 IEEE, pp. 478-479.

(Continued)

*Primary Examiner* — Michael T Tran

(57) ABSTRACT

A non-volatile memory includes resistive cells, write circuitry, and write detect circuitry. Each resistive cell has a resistive storage element and is coupled to a corresponding first column line and corresponding second column line. The write circuitry is configured to provide a write current through a resistive storage element of a selected resistive memory cell during a write operation based on an input data value. The write detect circuitry is configured to generate a reference voltage using a voltage at the corresponding first column line coupled to the selected resistive memory cell at an initial time of the write operation, and, during the write operation, after the initial time, provide a write detect signal based on a comparison between the voltage at the corresponding first column line coupled to the selected resistive memory cell and the reference voltage, wherein the input data value is based on the write detect signal.

21 Claims, 3 Drawing Sheets

(52) U.S. Cl.
CPC .............. *G11C 17/16* (2013.01); *G11C 17/18* (2013.01); *G11C 11/1655* (2013.01); *G11C 11/1657* (2013.01)

(58) Field of Classification Search
USPC ................................................. 365/158, 173
See application file for complete search history.

(56) References Cited

U.S. PATENT DOCUMENTS

| | | | | |
|---|---|---|---|---|
| 10,984,861 | B1* | 4/2021 | Naveh | G11C 11/1675 |
| 11,342,015 | B1* | 5/2022 | Chiang | G11C 11/1659 |
| 2012/0039110 | A1* | 2/2012 | Maejima | G11C 13/0007 |
| | | | | 365/148 |
| 2013/0250657 | A1 | 9/2013 | Haukness et al. | |
| 2015/0187394 | A1* | 7/2015 | Lee | G11C 7/065 |
| | | | | 365/207 |
| 2015/0243352 | A1* | 8/2015 | Park | G11C 13/0004 |
| | | | | 365/163 |
| 2015/0348624 | A1* | 12/2015 | Jang | G11C 13/0028 |
| | | | | 365/148 |
| 2015/0357036 | A1* | 12/2015 | Park | G11C 13/0038 |
| | | | | 365/148 |
| 2018/0122462 | A1* | 5/2018 | Lee | G06F 12/0802 |
| 2019/0272870 | A1* | 9/2019 | Choi | G11C 11/1675 |
| 2020/0075099 | A1* | 3/2020 | Choi | G11C 19/08 |
| 2020/0144330 | A1* | 5/2020 | Majhi | H01L 27/2454 |
| 2020/0168261 | A1* | 5/2020 | Jaiswal | H01L 27/222 |
| 2020/0241840 | A1* | 7/2020 | Ikegami | G11C 11/1657 |
| 2020/0265883 | A1* | 8/2020 | Hanyu | G11C 11/1659 |
| 2020/0279992 | A1* | 9/2020 | Pham | H01L 27/228 |
| 2020/0321393 | A1* | 10/2020 | Manipatruni | H01L 27/222 |
| 2021/0066580 | A1* | 3/2021 | Song | H01L 43/12 |
| 2022/0148635 | A1* | 5/2022 | Yogendra | G11C 11/18 |

OTHER PUBLICATIONS

U.S. Appl. No. 16/845,315, Sanjeevarao, Padmaraj: "Non-Volatile Memory With Multiplexer Transistor Regulator Circuit", filed Apr. 10, 2020.
U.S. Appl. No. 17/032,516, Ramanan, Karthik: "Non-Volatile Memory Having Virtual Ground Circuitry", filed Sep. 25, 2020.
U.S. Appl. No. 17/032,537, Choy, Jon Scott: "Non-Volatile Memory Having Virtual Ground Circuitry", filed Sep. 25, 2020.

* cited by examiner

NON-VOLATILE MEMORY HAVING WRITE DETECT CIRCUITRY

BACKGROUND OF THE INVENTION

Field of the Invention

This invention relates to non-volatile memories, and more specifically, to non-volatile memories having write detect circuitry.

Background

Non-volatile memories are utilized for storing data in an electronic system including when the system is powered down. One type of non-volatile memory is a resistive memory, in which each bit cell of a resistive memory includes a resistive storage element which is in either a high resistive state (HRS) or a low resistive state (LRS), depending on the logic state of the bit cell. In some embodiments, a bit cell can become an OTP cell by destructively writing and fusing the bits cell, leaving it in a permanent shorted state. However, once the destructive write occurs, the bit cell and periphery circuitry of the memory array may experience increased stress.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a memory includes an array of resistive memory cells and write detect circuitry to prevent stresses during the write operation or in subsequent write operations. The resistive storage element of a reprogrammable resistive cell can be placed into the HRS or the LRS based on a direction of a write current through the resistive storage element, while the resistive storage element in an OTP resistive cell can either be in a permanently blown state due to a high write current through the resistive storage element or in a non-blown state (in which the storage element can be in the HRS or LRS). In the blown state, the resistive storage element has a relatively low resistance as compared to either the HRS or the LRS.

A write operation to a resistive cell can be very long, especially for OTP writes which permanently blow the resistive cell. For example, these write operations can last microseconds across multiple pulse cycles. However, it is possible that, during an OTP write, a resistive cell can be fused to the permanent conductive state (i.e. blown) in a much shorter amount of time (such as within only 100s of nanoseconds). Once the resistive storage element is blown, the write current increases dramatically for the remainder of the write operation due to the relatively low resistance of the storage element. This write current induces stress onto the entire memory array, as well as the periphery circuits, and can reach the limits of the reliability of devices as well as the blown resistive cell.

Therefore, in one aspect, write detect circuitry which uses a self-referencing reference, is used to stop an ongoing OTP write when the blown resistance is achieved, and also prevent further writes to the blown cell. The use of the self-referencing reference, as compared to a fixed or global reference, helps compensate for the variability between resistive cells which are in a same state. This variability may be due, for example, to process variations. In one embodiment, the self-referencing reference is provided by a sample and hold circuit, and the detection of the desired blown resistance by the write detect circuitry during the write is performed using the same sense amplifiers which are used with the read circuitry to perform read operations.

Figure 1:
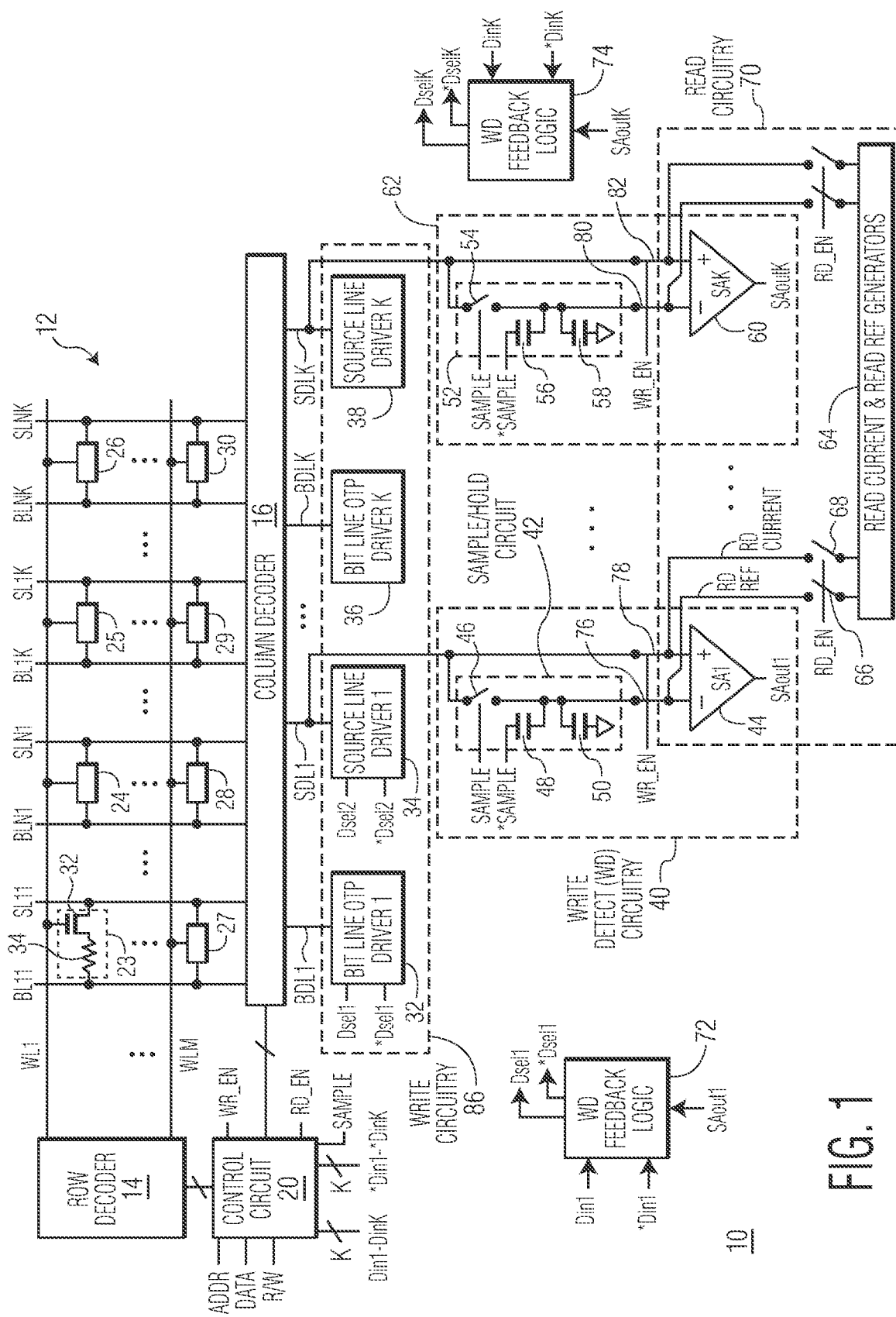
FIG. 1 is a circuit diagram of a non-volatile memory circuit according to one embodiment of the present invention.

FIG. 1 illustrates a circuit diagram of a non-volatile memory circuit 10 according to one embodiment of the present invention. Memory circuit 10 includes an array 12 of non-volatile memory cells (e.g. 23-30), a control circuit 20, a row decoder 14, a column decoder 16, write circuitry 86, read circuitry 70, write detect (WD) circuitries 40 and 62, and WD feedback logic 72 and 74. In one embodiment, the memory cells of array 12 are characterized as resistive memory cells with a select transistor (e.g. 32) and a resistive storage element (e.g. 34). Types of resistive memory cells include, for example, MRAM, ReRAM, carbon nanotube, and phase change memory cells. In some embodiments, the resistive storage elements of the resistive memory cells may be implemented by a magnetic tunnel junction (MTJ), therefore, each resistive memory cell may be described as including a select transistor (e.g. 32) and an MTJ (e.g. 34). Note that in the illustrated embodiments, the select gate transistors are N-type metal-oxide-semiconductor (NMOS) transistors. However, other types of resistive memory cells may have other configurations or maybe implemented with other types of resistive storage elements Memory cells 23-30 of FIG. 1 may be referred to as resistive cells or as bit cells.

In some embodiments, memory circuit 10 may be coupled to a processor circuit (not shown) of an electronic system that provides data to be written in the memory and receives the read data from the memory. Memory 10 is also coupled to supply voltage terminals coupled to receive corresponding supply voltages, such as VDD and VSS, in which VDD is greater than VSS. In one embodiment, VSS is true ground or 0V. Note that as used herein, VDD and VSS may also refer to the voltage supply terminals which receive the corresponding supply voltages.

The memory cells of array 12 are arranged in rows and columns. Each cell of a row is coupled to a corresponding word line of WL1-WLM for controlling the select transistor (e.g. 32) of the cell to access the resistive storage element (e.g. 34) of the cell during a memory operation. The word lines are controlled by a row decoder 14 which asserts a selected one of the word lines based on a first portion of an address received by a controller 20 of memory circuit 10 for the memory operation. Array 12 includes M number of rows with 2 rows being shown in FIG. 1. However, an array may include a different number of rows in other embodiments. For example, an 8 Mb memory array may have 2048 rows plus a few (e.g., 2 or 4) redundant rows.

In the embodiment shown, the cells of each column of array 12 are coupled to a corresponding source line of SL11-SLNK and a corresponding bit line of BL11-BLNK. Array 12 includes N*K source lines and N*K bit lines, in which FIG. 1 illustrates four source lines (e.g. SL11, SLN1, SL1K, and SLNK) and four bit lines (e.g. BL11, BLN1, BL1K, and BLNK). However, array 12 may have a different number of columns in other embodiments. (e.g. 64*N). In other embodiments, each column of an array may include a source line paired with two bit lines, a single bit line, or different combinations of bit lines and source lines. As described herein, a "column line" or "column" may refer to either a source line or a bit line.

In the embodiment shown, memory circuit 10 includes a column decoder 16 for selecting a subset of the bit lines and source lines (SL11-SLNK, BL11-BLNK) to provide as bit data lines (BDL1-BDLK) and source data lines (SDL1-SDLK), respectively. In the illustrated embodiment, both the bit data lines and the source data lines are provided to write circuitry 86. The source data lines are provided to the WD circuitry (e.g. WD circuitry 40 and 62) and to read circuitry 70. However, in alternate embodiments, the bit data lines rather than the source data lines can be provided to read circuitry 70. Column decoder 16 includes a bit line multiplexer for selecting a subset of the bit lines (BL11-BLNK) and a source line multiplexer for selecting a subset of the source lines (SL11-SLNK) during a memory operation. Control circuit 20 provides control signals, based on a second portion of the ADDRESS received by control circuit 20, to column decoder 16 to appropriately control the bit line and source line MUXes. Control circuit 20 may also generate WR_EN and RD_EN using the read/write signal (R/W) received by control circuit 20 as part of the control signals for a memory access request.

Column decoder 16 selects K number of selected bit lines and selected source lines from a total number of K*N bit lines and source lines of array 12 based on the second portion of the ADDRESS received by control circuit 20 for the memory operation. In some embodiments, K represents the size of the data unit (e.g. 8, 16, 32, 64 bits) being written to or read from memory array 12 during a memory operation. In other embodiments, K may include multiple data units (e.g. 128 bits, 256 bits) in a row. N represents the decode ratio (e.g. 4 to 1, 8 to 1, 16 to 1) of column decoder 16. That is, referring to array 12, bit lines BL11-BLNK includes K groups of N bit lines each, such that the first number of the index refers to one of the N bit lines within a particular group of the K groups, and the second number of the index refers to one of the K groups. For example, BL31 refers to bit line 3 in group 1, and BLNK refers to bit line N in group K. The same arrangement and nomenclature applies for source lines SL11-SLNK.

In one embodiment of resistive memory array 12 where the memory cells each include an MTJ as the resistive storage element, when current flows through the resistive storage element of a memory cell in a first direction, the memory cell is written to a low resistive state (LRS) in which the magnetic moments of the interacting magnetic layers of the MTJ are aligned in the same direction, and when current flows in a second direction, opposite the first direction, through the resistive storage element, the memory cell is written to a high resistive state (HRS) in which the magnetic moments of the interacting magnetic layers of the MTJ are not aligned in the same direction. In one embodiment, an HRS corresponds to a logic level "1" and an LRS corresponds to a logic level "0". However, in alternate embodiments, the LRS may correspond to the logic level "1" and the HRS to the logic level "0". In one embodiment, the resistance of the HRS is 2-3 times the resistance of the LRS, in which the resistance of the LRS may be in a range of 2 k-8 k Ohms.

The cells of array 12 can be utilized as reprogrammable resistive cells where a data state can be changed multiple times over the life of array 12 or OTP cells where a data state can be permanently programmed in the cell. In the illustrated embodiment, all cells of array 12 are utilized as OTP cells, but the structure of the MTJs in an OTP cell is the same as they would be in a reprogrammable resistive cell.

During a normal (i.e. non-OTP) write operation to a reprogrammable resistive cell of a column, a bit line driver corresponding to the column couples the bit line (e.g. BL11) of the column to one write voltage of either VDD or VSS and a source line driver corresponding to the column couples the source line (e.g. SL11) of the column to the other write voltage of VDD or VSS, depending on the data value being written as determined by the write data values (Din1-DinK) and the complementary write data values (*Din1-*DinK). (The write data values are received by control circuit 20 as write data corresponding to a received memory write request along with ADDR and R/W.) During the write operation, the select transistor (e.g. 32) is made conductive by assertion of the appropriate word line to provide a voltage differential across the resistive storage element (e.g. 34) whose polarity determines whether a 1 or 0 is written to the cell.

While a reprogrammable resistive cell can be in the HRS or the LRS, an OTP cell (or the resistive storage element within the OTP cell) can either be in a permanently blown state or in a non-blown state. Assuming cell 23 is an OTP cell, during an OTP write operation, a sufficiently higher voltage differential can be applied between the corresponding bit line (e.g. BL11) and corresponding source line (e.g. SL11) when select transistor 132 is conductive to break down the resistance of the resistive storage element of the OTP cell (e.g. in the case of an MRAM, to permanently break down the tunnel dielectric layer within the MTJ). In this manner, the resistive storage element (e.g. MTJ 34) results in having a relatively low resistance value (i.e. a shorted state) as compared to the resistance value of a non-blown cell (whether in the HRS or the LRS). As used herein, a cell whose resistive storage element is in a shorted state (e.g. in the case of an MTJ, a cell whose tunnel dielectric has been permanently broken down) is referred to as a blown cell (or a fused cell) and is thus in a permanently blown state. Note that a blown cell, a blown resistive storage element, or a blown MTJ may also be referred to as a shorted cell, shorted resistive storage element, or shorted MTJ.

In one embodiment, a blown cell corresponds to permanently storing an OTP value of one (1). In one embodiment, a non-blown cell (i.e. a cell being in the non-blown state), regardless of whether it is in a HRS or a LRS, corresponds to storing a value of zero (0). (In an alternate embodiment, a blown cell may correspond to permanently storing an OTP value of zero and a non-blown cell corresponds to storing a value of one.) Once a cell has been blown, it cannot be programmed to provide the HRS or the LRS value, regardless of the alignment of the magnetic moments. Therefore, any write operation to a blown OTP cell should not change the stored value of the cell.

Since all resistive cells in array 12 are assumed to be OTP cells, note that write circuitry 86 includes bit line OTP drivers (e.g. 32 and 36) and source line drivers (e.g. 34 and 38). Bit line OTP drivers couples the bit line of a selected column to a voltage higher than VDD, e.g. VB, while the source line driver couples the source line of the selected column to ground to provide the higher voltage differential over the selected MTJ in order to break down the resistance of the selected MTJ. Therefore, in the illustrated embodiment, write circuitry 86 includes only bit line OTP drivers which would only allow for OTP writes and not non-OTP writes to reprogrammable resistive cells. However, in alternate embodiments, the bit line drivers may include additional elements (such as additional switches to VDD) so as to be able to perform both OTP writes and non-OTP writes. In the illustrated embodiment, note that rather than the bit line OTP drivers and the source line drivers receiving write data values Dint-DinK and the complementary write values *Din1-*DinK, respectively, each driver receives modified data values Dsel1-DselK and the complementary modified write data values *Dsel1-*DselK, respectively. The bit value of each of Dsel1-DselK is generated by corresponding WD feedback logic (e.g. 72 and 74) based on Dint-DinK, respectively, and SAout1-SAoutK, respectively, as will be discussed in more detail below with respect to the WD circuitries.

Figure 2:
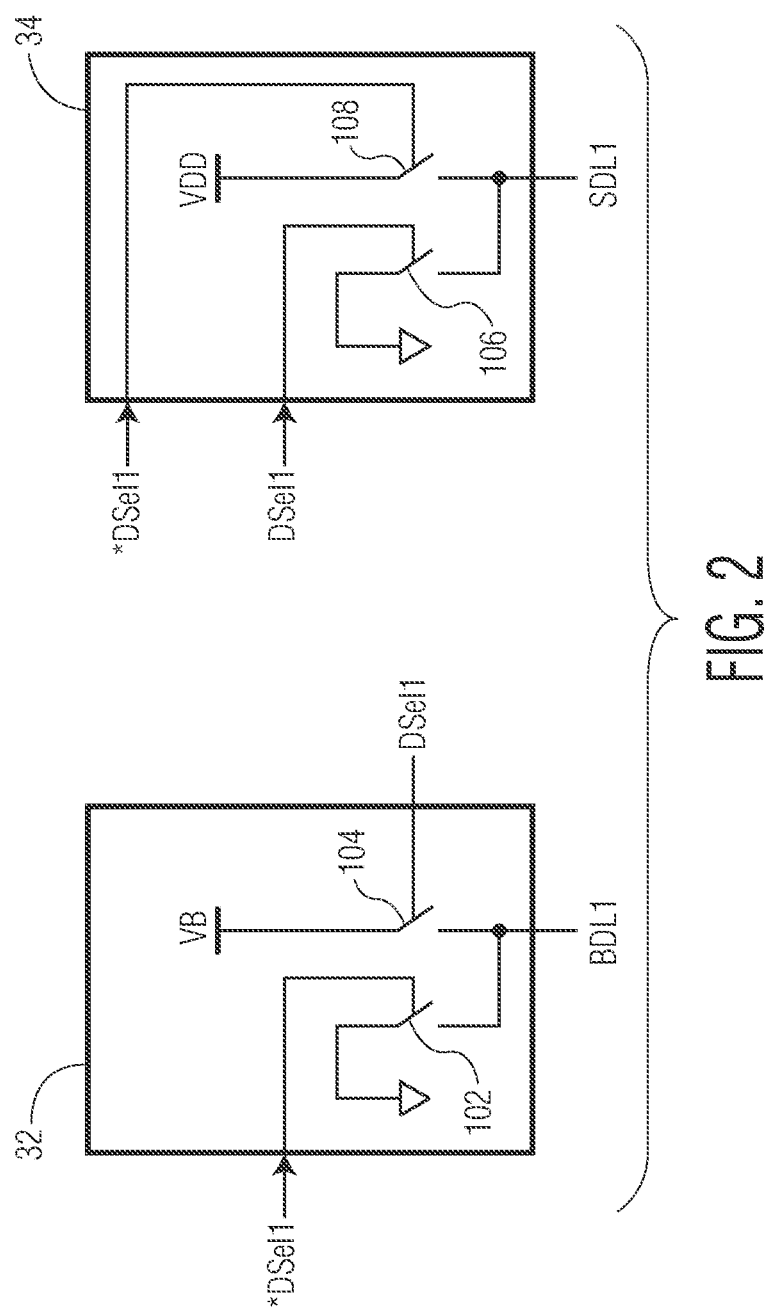
FIG. 2 is a circuit diagram of a write driver circuit of the write circuitry of FIG. 1 according to one embodiment of the present invention.

FIG. 2 illustrates more detailed views of bit line OTP driver 32 and source line driver 34. Bit line OTP driver 32 includes a switch 102 coupled between BLD1 and ground and a switch 104 coupled between BDL1 and VB (which corresponds to the OTP voltage supply used for OTP writes. Switch 104 is controlled by Dsel1 and switch 102 by *Dsel1. Source line driver 34 includes a switch 106 coupled between SDL1 and ground and a switch 108 coupled between SDL1 and VDD (which corresponds to the voltage supply used for non-OTP writes, and is less than VB). Switch 106 is controlled by Dsel1 and switch 108 by *Dsel1. Therefore, for an OTP write, in which the selected bit cell coupled to BDL1 and SDL1 is to be blown, Dsel1=1 and *Dsel1=0. Therefore, switch 104 couples BDL1 to VB and switch 106 couples SDL1 to ground, resulting in a large enough current through the selected bit cell coupled to BDL1 and SDL1 to blow the MTJ, permanently programming the MTJ to a relatively low resistance (lower than LRS). As will be described below in reference to the WD feedback logic circuit 72, note that the value of Dsel1/*Dsel1 for an OTP write is generated by WD feedback logic circuit 72 based on Din1/*Din1 and SAout1. Similarly, the same descriptions apply to all the bit line OTP drivers 1-K and all source line drivers 1-K, as well as the corresponding WD feedback logic to generate Dsel1/*Dsel1-DselK/*DselK using Din1/*Din1-DinK/*DinK, respectively, and SAout1-SAoutK, respectively. Also, as will be described in reference to FIG. 3, each of switches 104 and 106 can be implemented as transistors and may therefore be referred to as transistors or driver transistors.

Referring back to FIG. 1, during a read operation, the selected source lines are provided to read circuitry 70 via column decoder 16 and via the source data lines (SDL1-SDLK). Read circuitry 70 includes K sense amplifiers SA1-SAK (e.g. 44 and 60), in which each sense amplifier provides a corresponding bit value output as SAout1-SAoutK. During a read operation, SAout1-SAoutK corresponds to the K-bit output read data value. Also, during a read operation, RD_EN is asserted, thus closing the read enable switches (e.g. 66 and 68) between the sense amplifiers and read current and read reference generators 64.

Each sense amplifier (e.g. 44, 60) of read circuitry 70 has an inverting input (−) coupled to a reference path, and a non-inverting input (+) coupled to a corresponding column data line (e.g. SDL1). During the read operation, a read reference current, RD REF, is provided to the reference path from read current and read reference generators 64 and a read current, RD CURRENT, is provided to the corresponding data line (e.g. SDL1) from read current and read reference generators 64. Read current and read reference generators can be implemented in any known way to perform reads from array 12. Note that the reference path can be a self-referenced path for an OTP read or a normal read reference path for a non-OTP read.

In one embodiment, each SA is implemented as a comparator. In the illustrated embodiment, the selected column data lines from column decoder 16 coupled to the sense amplifiers refer to the selected source data lines (e.g. SDL1). However, in alternate embodiments, the selected column data lines can refer to the selected bit data lines (e.g. BDL1). Also, in alternate embodiments, the inverting and non-inverting inputs may be swapped.

During a read operation, RD_EN is asserted, closing the enable switches (e.g. switches 66 and 68) such that a forced read current, RD CURRENT, is provided to the input of the sense amplifier. The current on the source data line (e.g. SDL1) determines the voltage at the non-inverting input and the current in the reference path determines the voltage at the inverting input. The sense amplifier compares the resulting voltages at it inputs and provides the output data bit (e.g. SAout1) as a "0" if the voltage at the inverting input is greater than the voltage at the non-inverting input and a "1" otherwise. Note that each sense amplifier is coupled to a corresponding source data line and reference path analogous to the description of SA1. For example, SAK has a non-inverting input coupled to SDLK, and an inverting input coupled to a corresponding reference path.

During OTP write operations, the sense amplifiers of read circuitry 70 can be used as part of the WD circuitries (e.g. 40 and 62). Each write detect circuitry uses a self-referencing reference to stop an ongoing OTP write when the blown resistance is achieved. (As will be described below, WD feedback logic coupled to the sense amplifiers is used to prevent further writes to the blown cell.) Each write detect circuitry is coupled to a corresponding column line (e.g. SDL1) from column decoder 16, and includes a corresponding sense amplifier (e.g. SA1) of read circuitry 70 which provides its corresponding output SA1. However, the inputs to the sense amplifiers during an OTP write operation are provided via write enable switches (e.g. 76 and 78) which are controlled by WR_EN. Therefore, during an OTP write, WR_EN is asserted (and RD_EN is negated), thus closing the write enable switches at the inputs of the sense amplifiers (e.g. 76 and 78) and opening the read enable switches at the inputs of the sense amplifiers (e.g. 66 and 68)

Each write detect circuitry (e.g. 40 and 62) includes a corresponding sample and hold circuit (e.g. 42 and 52) coupled between the corresponding column line (e.g. SDL1 and SDLK) and the corresponding sense amplifier (e.g. SA1 and SAK). In the illustrated embodiment, the sample and hold circuits are coupled via the write enable switches to the inverting inputs of the corresponding SA. The non-inverting inputs of the corresponding SA are simply coupled to the corresponding column line. Operation of write detect (WD) circuitry 40 will be described in more detail with respect to FIG. 3.

Figure 3:
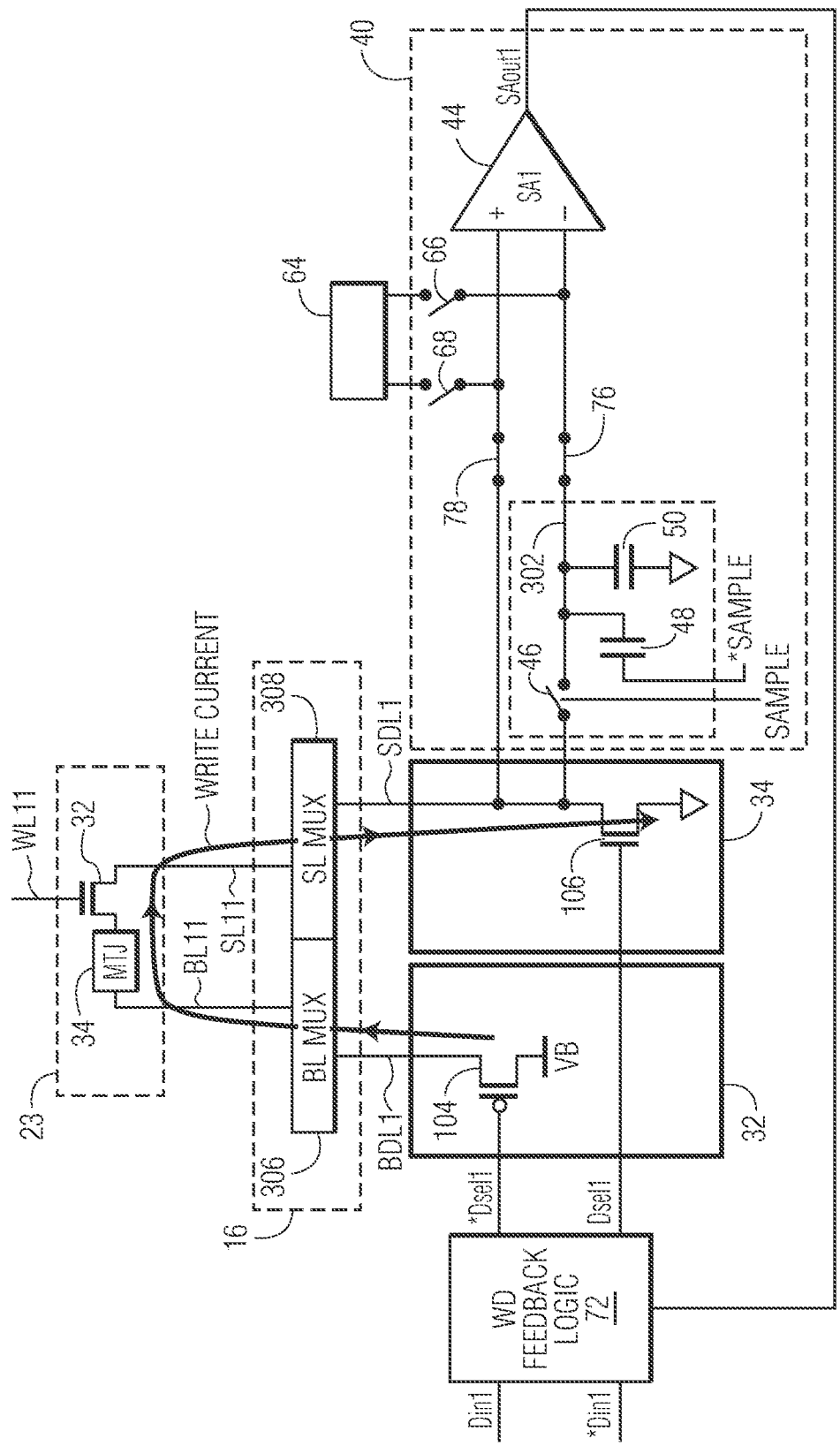
FIG. 3 is a circuit diagram of a portion of the non-volatile memory circuit of FIG. 1 during an OTP write operation according to one embodiment of the present invention.

FIG. 3 illustrates a portion of memory 10 of FIG. 1. In the illustrated embodiment, it is assumed that bit cell 23 is selected for an OTP write operation. In this case, based on the received access address, a bit line multiplexer (BL MUX) 306 of decoder 16 couples BL11 to BDL1, and a source line multiplexer (SL MUX) 308 of decoder 16 couples SL11 to SDL1. For the OTP write, a value of 1 is permanently stored to bit cell 23 by blowing MTJ 34. Therefore, bit line OTP driver 32 couples BDL1 to VB via switch 104 (implemented as a p-type metal oxide semiconductor device (PMOS)). Switch 104 receives *Dsel1 at a control input (note that switch 104, as illustrated in FIG. 2, receives Dsel1, but since it is implemented as a PMOS rather than an NMOS, assertion of Dsel corresponds to providing *Dsel). Source line driver 34 couples SDL1 to ground via switch 106 (implemented as an n-type metal oxide semiconductor device (NMOS)). Switch 106 receives Dsel1 at a control input. Therefore, during an OTP write, with Dsel1=1 (and thus *Dsel1=0), switch 104 is closed (i.e. the PMOS is conductive) and switch 106 is closed (i.e. the NMOS is conductive). Therefore, a large voltage differential (VB-0) is applied over MTJ 34 which blows the cell.

Once the selected cell is blown, the resulting resistance is very low (i.e. shorted) causing the write current to dramatically increase. However, this increased write current can undesirably stress array 12. Therefore, during a long write to blow the selected bit cell, which may include multiple cycles, the permanent fused state may be achieved early during the write operation. In this case, the write operation should be stopped so as not to continue to stress array 12. Also, with the selected bit cell in the blown state, subsequent writes need not be performed to the blown cell which would similarly result in write currents that could stress the array. Therefore, in one embodiment, write detect circuitry is used to determine when the OTP write achieves the desired blown resistance and stops the conduction of the write current by opening switches 104 and 106. In the illustrated embodiment, this is done by asserting SAout1 when the desired blown resistance is achieved, in which SAout1 is provided back to WD feedback logic 72. WD feedback logic 72 alters the values of Dsel1/*Dsel1 (to a 0/1) so as to make each of the PMOS and the NMOS of switches 104 and 106 non-conductive. Therefore, note that WD feedback logic 72 provides Din1/*Din1 as Dsel1/*Dsel1 until SAout1 is asserted, at which point, Dsel1/*Dsel1 remains 0/1 for the selected cell for the remainder of the write and for all subsequent writes. (In one embodiment, copies of SAout1 for a particular MTJ may be stored within WD feedback logic 72).

WD circuitry 40 uses SA1 of read circuitry 70 to detect when a sufficiently low resistance (i.e. the blown or shorted state) of the selected MTJ has been achieved. Upon achieving the blown state, the write current dramatically increases, resulting in an increase of the voltage. In one embodiment, the corresponding sense amplifier is used to compare the initial voltage (due to the initial write current) to subsequent voltages (due to the subsequent write current) to determine when a large increase in current has occurred. The initial voltage provides the reference voltage to the inverting input of SA1 while the non-inverting input of SA1 is coupled directly to SDL1 (e.g. the drain of transistor 106). The reference voltage is obtained with sample and hold circuit 42 coupled to SDL1 (e.g. the drain of transistor 106). Therefore, sample and hold circuit 42 provides a self-referenced reference voltage to SA1 which is compared to the voltage at SDL1 (corresponding to the drain to source voltage, VDS, of transistor 106).

Sample and hold circuit 42 includes a switch 46 (also referred to as a sampling switch) in which a first terminal of switch 46 is coupled to SDL1 at the first current electrode (e.g. drain) of NMOS 106. A second current electrode of NMOS 106 (e.g. source) is coupled to ground. A second terminal of switch 46 is coupled to the non-inverting input of SA1 via a circuit node 302 and closed write enable switch 76. A control electrode of switch 46 is coupled to receive a sample signal, which is asserted to sample the voltage on SDL1 and negated otherwise. Sample and hold circuit 42 includes a capacitor 50 having a first terminal coupled to node 302 and a second terminal coupled to ground. Sample and hold circuit 42 includes a boost capacitor 48 having a first terminal coupled to node 302 and a second terminal coupled to receive the complement of the sample signal, *sample. Note also that SDL1 is coupled to the non-inverting input of SA1 via circuit node 304 and closed write enable switch 78.

In operation, upon beginning an OTP write operation (in which WR_EN is asserted and RD_EN is negated), sample is asserted to a logic level one which closes switch 46. In response, the initial voltage on SDL1 (corresponding to the VDS of transistor 106) is sampled by sample and hold circuit 42, in which both capacitors 48 and 50 are charged. Note that the second terminal of capacitor 48, during the sampling, is at 0 volts (since *sample=0). At some time later (but far sooner than the end of the standard OTP write time), sample is negated to a logic level zero which opens switch 46. At this point, the second terminal of capacitor 48 is at VDD (since *sample=1) such that capacitor 48 provides a small voltage boost to node 302 at the inverting input of SA1. This ensures that when the sample signal is first negated, the inverting input is greater than the non-inverting input such that SAout1 is provided as zero. (Note that in alternate embodiments, rather than relying on boost capacitor 48 to ensure that SAout1 is provided initially as zero prior to the increase in current, a sense amplifier with hysteresis can instead be employed for SA1.)

During the OTP write, while the blown state has not yet been achieved, the voltage on SDL1 (corresponding to VDS of transistor 106) remains about the same and SAout1 continues being provided as zero. However, once the blown state is achieved, the write current increases dramatically, resulting in a large increase in the voltage of SDL1 (e.g. the VDS of transistor 106). With this increase in voltage at the non-inverting input, SA1 is tripped such that SAout1 is now asserted at one. In response to the assertion of SAout1 to one, WD feedback logic 72 negates Dsel1 to zero and thus *Dsel1 to one. This stops the write current from flowing though the selected bit cell by turning off (opening) switches 106 and 104. Therefore, while the OTP write cycle may still continue, no additional write current is provided through the selected MTJ which has already achieved its blown state. Also, during any subsequent write to the same bit cell, WD feedback logic 72 prevents further write current through the bit cell by preventing switches 106 and 104 from being turned on (closed).

Note that in FIG. 3, read current and read reference generators 64 is also coupled to SA1 but via read enable switches 68 and 66. However, during any OTP write operations, RD_EN is negated, thus opening switches 68 and 66. In this manner, SA1 can be dually used to provide read output data during read operations as well as perform detection of the achieved blown state during OTP write operations. That is, during a read operation, SAout1 corresponds to the first bit of the read data while during an OTP write, SAout1 provides an indication of whether or not the blown or shorted state has been achieved (whether or not to stop or prevent a write current from being provided through a selected bit cell). Therefore, during a write operation in which SAout1 is generated by WD circuitry 40, SAout1 may be referred to instead as a write detect signal or write detect indicator. Although FIG. 3 has been described in reference bit cell 23, drivers 32 and 34, WD feedback logic 72, and SA1, note that the descriptions also apply to any selected cell and to any of the WD circuitries, including their corresponding sample and hold circuits, and the SAs. Also, the SAs can have any design. For example, in one embodiment, the sense amplifiers are continuous time sense amplifiers. Alternatively, they can be clocked sense amplifiers.

Note that by using a self-referencing scheme in which the voltage at the selected SDL (measured as the VDS over a corresponding driver transistor) is itself initially sampled as the reference for the corresponding SA for comparison to the selected SDL, each corresponding SA will be appropriately tripped regardless of the process variations across the SAs (e.g. SA1-SAK). In alternate embodiments, additional sense amplifiers or comparators can be added to memory 10 to perform the write detection with the sample and hold circuits rather than reusing those of the read circuitry. Also, in other embodiments, the read circuitry and the WD circuitry may instead use the bit lines rather than the source lines. For example, BDL1-K may be used rather than SDL1-K for the reads and for the WD circuitry.

Therefore, by now it can be understood how stress due to large OTP write currents through blown bit cells can be reduced or prevented through the use of WD circuitry. This WD circuitry detects when a selected bit cell has achieved its blown state, and in response, stops a write current during the ongoing OTP write, and can prevent any future OTP writes to that selected bit cell. In one embodiment, during an OTP write, the WD circuitry uses a sample and hold circuit coupled to a corresponding column line (e.g. corresponding SDL) to generate a self-referencing reference voltage which is compared with the voltage of the corresponding column during the write to determine if the blown state of the selected bit cell has been reached. Note that the column line voltages can be measured as the VDS of a corresponding drive transistor. In one embodiment, the SAs of the read circuitry can be reused during the writes by the WD circuitry to perform the comparison.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

In one embodiment, a non-volatile memory includes an array of resistive cells, each resistive cell having a resistive storage element and coupled to a corresponding first column line of a plurality of first column lines and a corresponding second column line of a plurality of second column lines; write circuitry configured to provide a write current through a resistive storage element of a selected resistive memory cell of the array of resistive cells during a write operation based on an input data value; and write detect circuitry. The write detect circuitry is configured to generate a reference voltage using a voltage at the corresponding first column line coupled to the selected resistive memory cell at an initial time of the write operation, and, during the write operation, after the initial time, provide a write detect signal based on a comparison between the voltage at the corresponding first column line coupled to the selected resistive memory cell and the reference voltage, wherein the input data value to the write circuitry is based on the write detect signal. In one aspect, the input data value is based on a received write data value corresponding to the write operation and the write detect signal. In a further aspect, the input data value results in the write current through the resistive storage element of the selected resistive memory cell when the write data value has a first value and the write detect signal is negated, and the input value results in preventing the write current from going through the resistive storage element of the selected resistive memory cell when the write data value has the first value and the write detect signal is asserted. In yet a further aspect, the write detect signal is asserted during the write operation when a resistance of the resistive storage element of the selected resistive memory cell reaches a desired resistance. In another aspect of the embodiment, the write operation is characterized as a one-time programmable (OTP) write in which the write current through the resistive storage element of the selected resistive memory cell results in blowing the resistive storage element of the selected resistive memory cell to permanently store a bit value in the selected resistive memory cell. In a further aspect, the write detect circuitry is configured to, during the initial time of the write operation, negate the write detect signal, and, during the write operation, after the initial time, asserted the write detect signal when the resistive storage element of the selected resistive memory cell reaches a desired resistance. In yet a further aspect, the desired resistance corresponds to a resistance of a resistive storage element which is in a blown state. In another aspect of the embodiment, the write detect circuitry comprises a sample and hold circuit and a sense amplifier, wherein the sample and hold circuit is coupled via a sampling switch to the corresponding first column line coupled to the selected resistive memory cell, wherein the sample and hold circuit is configured to generate the reference voltage, and the sense amplifier has a first input coupled to receive the reference voltage, a second input coupled to the corresponding first column line coupled to the selected resistive memory cell, and an output configured to provide the write detect signal. In a further aspect, the sampling switch is configured to be closed at the initial time of the write operation and open during the write operation after the initial time. In yet a further aspect, the non-volatile memory further includes a boost capacitor coupled to the first input of the sense amplifier and configured to provide a boost voltage when the sampling switch is opened during the write operation. In another further aspect, the non-volatile memory includes read circuitry configured to, during a read operation, couple the sense amplifier to the read circuitry, wherein the sense amplifier is configured to, during the read operation, provide a read bit value from a selected resistive cell of the array of resistive cells of the read operation. In another aspect of the embodiment, generating the reference voltage using the voltage at the corresponding first column line coupled to the selected resistive memory cell at an initial time of the write operation corresponds to generating the reference voltage based on a drain-to-source voltage of a corresponding driver transistor of the write circuitry. In another aspect, the plurality of first column lines are characterized as source lines and the plurality of second column lines are characterized as bit lines.

In another embodiment, a non-volatile memory includes an array of resistive cells, each resistive cell having a resistive storage element and coupled to a corresponding first column line of a plurality of first column lines; write circuitry configured to provide a write current through a selected resistive storage element of a selected resistive memory cell of the array of resistive cells during a write operation based on an input data value, wherein the input data value is based on a received write data value corresponding to the write operation and a write detect signal; and write detect circuitry including a sample and hold circuit and a sense amplifier. The sample and hold circuit is configured to, during an initial time of the write operation, generate a reference voltage based on a voltage at the corresponding first column line coupled to the selected resistive memory cell, and a sense amplifier has a first input coupled to receive the reference voltage, a second input coupled to the corresponding first column line coupled to the selected resistive memory cell, and an output configured to provide the write detect signal during the write operation, wherein the sense amplifier is configured to assert the write detect signal when a desired resistance of the selected resistive storage element is achieved. In a further embodiment, the sampling switch is configured to be closed at the initial time of the write operation and open during the write operation after the initial time. In yet a further embodiment, the non-volatile memory further includes a boost capacitor coupled to the first input of the sense amplifier and configured to provide a boost voltage when the sampling switch is opened during the write operation. In another aspect, the non-volatile memory includes read circuitry configured to, during a read operation, couple the sense amplifier to the read circuitry, wherein the sense amplifier is configured to, during the read operation, provide at the output a read bit value from a selected resistive cell of the array of resistive cells of the read operation. In yet another aspect, the write operation is characterized as a one-time programmable (OTP) write in which the write current through the resistive storage element of the selected resistive memory cell results in blowing the resistive storage element of the selected resistive memory cell to permanently store a bit value in the selected resistive memory cell. In a further aspect, the desired resistance corresponds to a resistance of a resistive storage element which is in a blown state, and assertion of the write detect signal prevents further write current through the selected resistive storage element for a remainder of the write operation. In another aspect of the another embodiment, the input data value results in the write current through the resistive storage element of the selected resistive memory cell when the write data value has a first value and the write detect signal is negated, and the input value prevents the write current from going through the resistive storage element of the selected resistive memory cell when the write data value has the first value and the write detect signal is asserted.

What is claimed is:

1. A non-volatile memory, comprising:
an array of resistive cells, each resistive cell having a resistive storage element and coupled to a corresponding first column line of a plurality of first column lines and a corresponding second column line of a plurality of second column lines;
write circuitry configured to provide a write current through a resistive storage element of a selected resistive memory cell of the array of resistive cells during a write operation based on an input data value; and
write detect circuitry configured to:
generate a reference voltage using a voltage at the corresponding first column line coupled to the selected resistive memory cell at an initial time of the write operation, and
during the write operation, after the initial time, provide a write detect signal based on a comparison between the voltage at the corresponding first column line coupled to the selected resistive memory cell and the reference voltage, wherein the input data value to the write circuitry is based on the write detect signal,
wherein the input data value is based on a received write data value corresponding to the write operation and the write detect signal, and
wherein the input data value results in the write current through the resistive storage element of the selected resistive memory cell when the write data value has a first value and the write detect signal is negated, and the input value results in preventing the write current from going through the resistive storage element of the selected resistive memory cell when the write data value has the first value and the write detect signal is asserted.

2. The non-volatile memory of claim 1, wherein the write detect signal is asserted during the write operation when a resistance of the resistive storage element of the selected resistive memory cell reaches a desired resistance.

3. A non-volatile memory, comprising:
an array of resistive cells, each resistive cell having a resistive storage element and coupled to a corresponding first column line of a plurality of first column lines and a corresponding second column line of a plurality of second column lines;
write circuitry configured to provide a write current through a resistive storage element of a selected resistive memory cell of the array of resistive cells during a write operation based on an input data value; and
write detect circuitry configured to:
generate a reference voltage using a voltage at the corresponding first column line coupled to the selected resistive memory cell at an initial time of the write operation, and
during the write operation, after the initial time, provide a write detect signal based on a comparison between the voltage at the corresponding first column line coupled to the selected resistive memory cell and the reference voltage, wherein the input data value to the write circuitry is based on the write detect signal,
wherein the write operation is characterized as a one-time programmable (OTP) write in which the write current through the resistive storage element of the selected resistive memory cell results in blowing the resistive storage element of the selected resistive memory cell to permanently store a bit value in the selected resistive memory cell.

4. The non-volatile memory of claim 3, wherein the write detect circuitry is configured to, during the initial time of the write operation, negate the write detect signal, and, during the write operation, after the initial time, asserted the write detect signal when the resistive storage element of the selected resistive memory cell reaches a desired resistance.

5. The non-volatile memory of claim 4, wherein the desired resistance corresponds to a resistance of a resistive storage element which is in a blown state.

6. A non-volatile memory, comprising:
an array of resistive cells, each resistive cell having a resistive storage element and coupled to a corresponding first column line of a plurality of first column lines and a corresponding second column line of a plurality of second column lines;
write circuitry configured to provide a write current through a resistive storage element of a selected resistive memory cell of the array of resistive cells during a write operation based on an input data value; and write detect circuitry configured to:
  generate a reference voltage using a voltage at the corresponding first column line coupled to the selected resistive memory cell at an initial time of the write operation, and
  during the write operation, after the initial time, provide a write detect signal based on a comparison between the voltage at the corresponding first column line coupled to the selected resistive memory cell and the reference voltage, wherein the input data value to the write circuitry is based on the write detect signal,
wherein the write detect circuitry comprises a sample and hold circuit and a sense amplifier, wherein:
  the sample and hold circuit is coupled via a sampling switch to the corresponding first column line coupled to the selected resistive memory cell, wherein the sample and hold circuit is configured to generate the reference voltage, and
  the sense amplifier has a first input coupled to receive the reference voltage, a second input coupled to the corresponding first column line coupled to the selected resistive memory cell, and an output configured to provide the write detect signal.

7. The non-volatile memory of claim 6, wherein the sampling switch is configured to be closed at the initial time of the write operation and open during the write operation after the initial time.

8. The non-volatile memory of claim 7, further comprising:
a boost capacitor coupled to the first input of the sense amplifier and configured to provide a boost voltage when the sampling switch is opened during the write operation.

9. The non-voltage memory of claim 6, wherein the non-volatile memory comprises read circuitry configured to, during a read operation, couple the sense amplifier to the read circuitry, wherein the sense amplifier is configured to, during the read operation, provide a read bit value from a selected resistive cell of the array of resistive cells of the read operation.

10. A non-volatile memory, comprising:
an array of resistive cells, each resistive cell having a resistive storage element and coupled to a corresponding first column line of a plurality of first column lines and a corresponding second column line of a plurality of second column lines;
write circuitry configured to provide a write current through a resistive storage element of a selected resistive memory cell of the array of resistive cells during a write operation based on an input data value; and
write detect circuitry configured to:
  generate a reference voltage using a voltage at the corresponding first column line coupled to the selected resistive memory cell at an initial time of the write operation, and
  during the write operation, after the initial time, provide a write detect signal based on a comparison between the voltage at the corresponding first column line coupled to the selected resistive memory cell and the reference voltage, wherein the input data value to the write circuitry is based on the write detect signal,
wherein generating the reference voltage using the voltage at the corresponding first column line coupled to the selected resistive memory cell at an initial time of the write operation corresponds to generating the reference voltage based on a drain-to-source voltage of a corresponding driver transistor of the write circuitry.

11. A non-volatile memory, comprising:
an array of resistive cells, each resistive cell having a resistive storage element and coupled to a corresponding first column line of a plurality of first column lines and a corresponding second column line of a plurality of second column lines;
write circuitry configured to provide a write current through a resistive storage element of a selected resistive memory cell of the array of resistive cells during a write operation based on an input data value; and
write detect circuitry configured to:
  generate a reference voltage using a voltage at the corresponding first column line coupled to the selected resistive memory cell at an initial time of the write operation, and
  during the write operation, after the initial time, provide a write detect signal based on a comparison between the voltage at the corresponding first column line coupled to the selected resistive memory cell and the reference voltage, wherein the input data value to the write circuitry is based on the write detect signal,
wherein the plurality of first column lines are characterized as source lines and the plurality of second column lines are characterized as bit lines.

12. A non-volatile memory, comprising:
an array of resistive cells, each resistive cell having a resistive storage element and coupled to a corresponding first column line of a plurality of first column lines;
write circuitry configured to provide a write current through a selected resistive storage element of a selected resistive memory cell of the array of resistive cells during a write operation based on an input data value, wherein the input data value is based on a received write data value corresponding to the write operation and a write detect signal;
write detect circuitry including a sample and hold circuit and a sense amplifier, wherein:
  the sample and hold circuit is configured to, during an initial time of the write operation, generate a reference voltage based on a voltage at the corresponding first column line coupled to the selected resistive memory cell, and
  the sense amplifier has a first input coupled to receive the reference voltage, a second input coupled to the corresponding first column line coupled to the selected resistive memory cell, and an output configured to provide the write detect signal during the write operation, wherein the sense amplifier is configured to assert the write detect signal when a desired resistance of the selected resistive storage element is achieved.

13. The non-volatile memory of claim 12, wherein the sampling switch is configured to be closed at the initial time of the write operation and open during the write operation after the initial time.

14. The non-volatile memory of claim 13, further comprising:
a boost capacitor coupled to the first input of the sense amplifier and configured to provide a boost voltage when the sampling switch is opened during the write operation.

15. The non-voltage memory of claim 12, wherein the non-volatile memory comprises read circuitry configured to, during a read operation, couple the sense amplifier to the read circuitry, wherein the sense amplifier is configured to, during the read operation, provide at the output a read bit value from a selected resistive cell of the array of resistive cells of the read operation.

16. The non-volatile memory of claim 12, wherein the write operation is characterized as a one-time programmable (OTP) write in which the write current through the resistive storage element of the selected resistive memory cell results in blowing the resistive storage element of the selected resistive memory cell to permanently store a bit value in the selected resistive memory cell.

17. The non-volatile memory of claim 16, wherein the desired resistance corresponds to a resistance of a resistive storage element which is in a blown state, and assertion of the write detect signal prevents further write current through the selected resistive storage element for a remainder of the write operation.

18. The non-volatile memory of claim 12, wherein the input data value results in the write current through the resistive storage element of the selected resistive memory cell when the write data value has a first value and the write detect signal is negated, and the input value prevents the write current from going through the resistive storage element of the selected resistive memory cell when the write data value has the first value and the write detect signal is asserted.

19. The non-volatile memory of claim 3, wherein the input data value is based on a received write data value corresponding to the write operation and the write detect signal.

20. The non-volatile memory of claim 10, wherein the input data value is based on a received write data value corresponding to the write operation and the write detect signal.

21. The non-volatile memory of claim 11, wherein the input data value is based on a received write data value corresponding to the write operation and the write detect signal.

* * * * *